United States Patent
Lee et al.

(10) Patent No.: US 12,237,153 B2
(45) Date of Patent: Feb. 25, 2025

(54) FORMING METHOD OF PLASMA RESISTANT OXYFLUORIDE COATING LAYER

(71) Applicant: KOREA INSTITUTE OF CERAMIC ENGINEERING AND TECHNOLOGY, Jinju-si (KR)

(72) Inventors: Sung min Lee, Seoul (KR); Yoon Suk Oh, Seoul (KR)

(73) Assignee: KOREA INSTITUTE OF CERAMIC ENGINEERING AND TECHNOLOGY, Jinju-si (KR)

( * ) Notice: Subject to any disclaimer, the term of this patent is extended or adjusted under 35 U.S.C. 154(b) by 88 days.

(21) Appl. No.: 17/978,778

(22) Filed: Nov. 1, 2022

(65) Prior Publication Data

US 2023/0215701 A1 Jul. 6, 2023

(30) Foreign Application Priority Data

Jan. 4, 2022 (KR) .......................... 10-2022-0000695

(51) Int. Cl.
*H01J 37/32* (2006.01)
*C23C 14/06* (2006.01)
(Continued)

(52) U.S. Cl.
CPC .... *H01J 37/32477* (2013.01); *C23C 14/0694* (2013.01); *C23C 14/083* (2013.01);
(Continued)

(58) Field of Classification Search
None
See application file for complete search history.

(56) References Cited

U.S. PATENT DOCUMENTS

2021/0172049 A1* 6/2021 Duan ...................... C23C 14/28

FOREIGN PATENT DOCUMENTS

| KR | 20010081024 A | | 8/2001 |
| KR | 20110117830 A | * | 10/2011 |
| KR | 10-2021-0070913 A | | 6/2021 |

OTHER PUBLICATIONS

Office Action issued on Feb. 1, 2024, for corresponding Korean Patent Application No. 10-2022-0000695, along with an English machine translation (7 pages).
(Continued)

*Primary Examiner* — Michael P. Rodriguez
(74) *Attorney, Agent, or Firm* — Hauptman Ham, LLP

(57) ABSTRACT

The present invention relates to a method of forming a plasma resistant oxyfluoride coating layer, including: mounting a substrate on a substrate holder provided in a chamber; causing an electron beam scanned from an electron gun to be incident on an oxide evaporation source accommodated in a first crucible, and heating, melting, and vaporizing the oxide evaporation source as the electron beam is incident on the oxide evaporation source; vaporizing a fluoride accommodated in a second crucible; and advancing an evaporation gas generated from the oxide evaporation source and a fluorine-containing gas generated from the fluoride toward the substrate, and reacting the evaporation gas generated from the oxide evaporation source and the fluorine-containing gas generated from the fluoride to deposit an oxyfluoride on the substrate. According to the present invention, it is possible to form a dense and stable oxyfluoride coating layer having excellent plasma resistance, suppressed generation of contaminant particles, and no cracks.

12 Claims, 11 Drawing Sheets

(51) Int. Cl.
    *C23C 14/08*     (2006.01)
    *C23C 14/24*     (2006.01)
    *C23C 14/26*     (2006.01)
    *C23C 14/30*     (2006.01)
    *C23C 14/50*     (2006.01)
    *H01J 37/147*     (2006.01)
    *H01J 37/06*     (2006.01)

(52) U.S. Cl.
    CPC ............ *C23C 14/243* (2013.01); *C23C 14/26* (2013.01); *C23C 14/30* (2013.01); *C23C 14/505* (2013.01); *H01J 37/1474* (2013.01); *H01J 37/06* (2013.01); *H01J 2237/182* (2013.01); *H01J 2237/3128* (2013.01); *H01J 2237/3132* (2013.01)

(56) References Cited

OTHER PUBLICATIONS

Office Action dated Oct. 25, 2024 for corresponding Korean Patent Application No. 10-2022-0000695, along with an English translation (6 pages).

\* cited by examiner

FORMING METHOD OF PLASMA RESISTANT OXYFLUORIDE COATING LAYER

CROSS-REFERENCE TO RELATED APPLICATION

This application claims priority to and the benefit of Korean Patent Application No. 10-2022-0000695, filed on Jan. 4, 2022, the disclosure of which is incorporated herein by reference in its entirety.

BACKGROUND

1. Field of the Invention

The present invention relates to a method of forming an oxyfluoride coating layer, and more particularly, to a method of forming a dense and stable oxyfluoride coating layer having excellent plasma resistance, suppressed generation of contaminant particles, and no cracks.

2. Discussion of Related Art

A plasma process not only promotes a chemical reaction with the material by generating radicals with high chemical activity, but also causes ions dissociated by plasma to be incident on a surface of the material with high energy to promote the reaction and cause physical etching of the material. A typical material with excellent plasma resistance is $Al_2O_3$, and recently, yttrium oxide ($Y_2O_3$), yttrium aluminum oxide ($Y_3Al_5O_{12}$), and the like, which have more excellent plasma resistance, have been adopted and widely used. Recently, the use of yttrium oxide and the like is being expanded to products in which yttrium oxide is coated on aluminum or aluminum oxide (alumina) by a method such as plasma thermal spraying or PVD, rather than a bulk-type product sintered at high temperature. These coated products have the advantage of being able to manufacture a plasma resistant member at low cost compared to bulk-type products manufactured by using the sintering method and have less risk of breakage.

When a product, in which $Al_2O_3$, $Y_2O_3$, or the like is coated on a substrate made of aluminum, alumina, or the like, is used as a component for semiconductor manufacturing equipment, the product is exposed to a vacuum plasma process environment containing a fluorine (F) element, which causes chemical deterioration of a ceramic coating layer. As such, when the ceramic coating layer is deteriorated by exposure to the vacuum plasma process environment, it appears in the form of contamination (particle type, reactant type) during the semiconductor manufacturing process, and provides a cause for lowering the wafer production yield. In addition, it causes an increase in the cost of post-processing for component recycling such as a cleaning process.

For example, when $Y_2O_3$ is exposed to fluorine-based plasma, contaminant particles including fluorine are formed on a surface layer, and when $Y_2O_3$ is subjected to a thermal cycle, stress is generated due to the difference in thermal expansion coefficient between the contaminant particles of the surface layer and $Y_2O_3$, and there is a problem in that the contaminant particles are dropped into the semiconductor manufacturing process equipment. The dropped contaminant particles cause a problem in that the yield of the product is lowered, thereby reducing the yield of wafer production.

Meanwhile, during a plasma etching process, fluorine radicals and fluorine-containing ions in the plasma react with $Y_2O_3$ on an inner wall of a chamber at a certain level or more and are consumed, so that the composition of the plasma changes depending on an internal position of the etching equipment, and thus there are problems that the uniformity of an etching rate for each position of the silicon wafer is deteriorated, and it takes a long time for the etching rate to reach a constant level for each wafer lot.

In order to suppress the drop-off of the surface-contaminant particles and secure the stability of the etching process, a method is being tried in which a $YO_xF_y$ coating layer is formed using a physical vapor deposition (PVD) method or the like, wherein the $YO_xF_y$ coating layer has a high bonding strength between surface particles and a substrate and already contains fluorine. However, in the case of the formation of the $YO_xF_y$ coating layer including fluorine, unlike the formation of the $Y_2O_3$ coating layer that is an oxide, not only the stability of the manufacturing process is deteriorated, but also a complicated and expensive method of several steps is required. For example, in the case of the typical PVD method such as an electron beam deposition method, a process of mixing a raw material including fluorine and a raw material including oxygen using a solvent and drying the resultant to prepare a mixed powder, a process of preparing the mixed powder into a shaped body, a process of hardening the shaped body by heat treatment at high temperature, and a process of preparing an evaporation source by pulverizing to a certain size are required. However, in the process of mixing using a solvent, oxidation of raw materials including fluorine occurs, and in the process (sintering) of hardening the shaped body by heat treatment at high temperature, fluorine volatilization occurs unevenly, causing a problem in that the fluorine content becomes irregular for each location of the evaporation source. Even when the evaporation source is prepared in this way, when power of an electron beam is adjusted to regulate a deposition rate during the process of melting the evaporation source with the electron beam and depositing, the evaporation rate of oxygen and fluorine fluctuates, such that there is a disadvantage in that it is very difficult to constantly maintain the oxygen and fluorine content in the deposited coating layer. In addition, in order to adjust the content ratio of the oxygen and fluorine in the coating layer to the intended use, since it is necessary to change the composition of an oxyfluoride, which is an evaporation source, there is a problem in that all processes such as drying, preparation of a shaped body, sintering, and pulverizing need to be restarted by changing the raw material mixture. In addition, the conventional method makes it impossible to continuously change the composition of the coating layer during the deposition process.

RELATED ART DOCUMENT

Korean Patent Publication No. 10-2001-0081024

SUMMARY OF THE INVENTION

The present invention is directed to providing a method of forming a dense and stable oxyfluoride coating layer having excellent plasma resistance, suppressed generation of contaminant particles, and no cracks.

The present invention provides a method of forming a plasma resistant oxyfluoride coating layer, including: mounting a substrate on a substrate holder provided in a chamber; causing an electron beam scanned from an electron gun to be incident on an oxide evaporation source accommodated in a first crucible, and heating, melting, and vaporizing the oxide evaporation source as the electron beam is incident on the oxide evaporation source; vaporizing a fluoride accommodated in a second crucible; and advancing an evaporation gas generated from the oxide evaporation source and a fluorine-containing gas generated from the fluoride toward the substrate, and reacting the evaporation gas generated from the oxide evaporation source and the fluorine-containing gas generated from the fluoride to deposit an oxyfluoride on the substrate.

The oxide evaporation source may include one or more materials selected from the group consisting of $Y_2O_3$ and $Al_2O_3$.

The fluoride may be a solid material.

The fluoride may include one or more solid materials selected from the group consisting of $NH_4F$, $NH_5F_2$, $MgF_2$, $AlF_3$, and $YF_3$.

A temperature of the substrate may be set in a range of 100 to 700° C.

Power applied to the electron gun through a power supply may be set in a range of 1 to 10 kW.

A vacuum degree in the chamber may be controlled to be in a range of 0.01 to 1 mTorr while the oxide evaporation source is evaporated.

The substrate holder may be set to rotate at a speed ranging from 1 to 100 rpm to form the oxyfluoride coating layer on the substrate.

Oxygen may be supplied into the chamber through a gas supply device while the oxide evaporation source is evaporated, and a flow rate of the supplied oxygen may be controlled to be in a range of 0.01 to 20 sccm.

A deposition rate of the oxyfluoride coating layer may be controlled to be in a range of 10 to 200 nm/min.

A thickness of the oxyfluoride coating layer may be controlled to be in a range of 0.2 to 50 μm.

The fluorine content contained in the oxyfluoride may be regulated by regulating the number of second crucibles accommodating the fluoride to adjust an evaporation amount of the fluoride.

The evaporation amount of the fluoride may also be regulated by regulating an opening of a second crucible cover for accommodating the fluoride.

A degree of opening and closing of the opening of the second crucible cover may be controlled over time to control the fluorine content of the oxyfluoride coating layer formed by deposition.

The fluoride may be evaporated without additional heating or evaporated using resistive electrical heating rather than a high energy heat source such as an electron beam.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
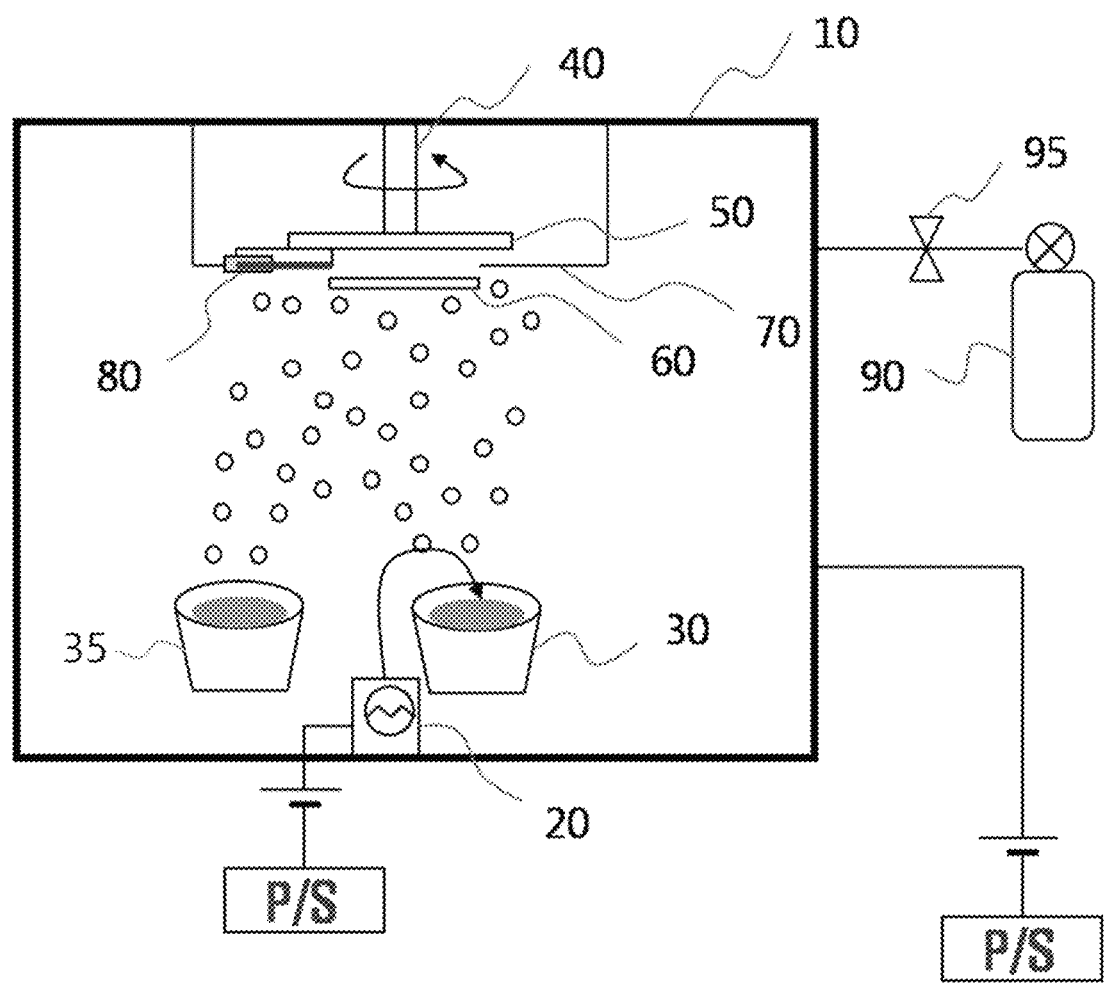
FIG. 1 is a diagram schematically illustrating a reactive physical vapor deposition apparatus for forming an oxyfluoride coating layer.

Hereinafter, an embodiment of the present invention will be described in detail with reference to the accompanying drawings. However, the following examples are provided so that those of ordinary skill in the art can fully understand the present invention, and can be modified into various other forms, and the scope of the present invention is not limited to the examples described below.

When it is said that any one component "include(s)" another component in the detailed description or claims of the invention, this should not be construed as being limited to being made up of only the component, unless otherwise stated, and it should be understood that other components may be further included.

A method of forming a plasma resistant oxyfluoride coating layer according to an exemplary embodiment of the present invention includes: mounting a substrate in a substrate holder provided in a chamber; causing an electron beam scanned from an electron gun to be incident on an oxide evaporation source accommodated in a first crucible, and heating, melting, and vaporizing the oxide evaporation source as the electron beam is incident on the oxide evaporation source; vaporizing a fluoride accommodated in a second crucible; and advancing an evaporation gas generated from the oxide evaporation source and a fluorine-containing gas generated from the fluoride toward the substrate, and reacting the evaporation gas generated from the oxide evaporation source and the fluorine-containing gas generated from the fluoride to deposit an oxyfluoride on the substrate.

The oxide evaporation source may include one or more materials selected from the group consisting of $Y_2O_3$ and $Al_2O_3$.

The fluoride may be a solid material.

The fluoride may include one or more solid materials selected from the group consisting of $NH_4F$, $NH_5F_2$, $MgF_2$, $AlF_3$, and $YF_3$.

A temperature of the substrate may be set in a range of 100 to 700° C.

Power applied to the electron gun through a power supply may be set in a range of 1 to 10 kW.

The vacuum degree in the chamber may be controlled to be in a range of 0.01 to 1 mTorr while the oxide evaporation source is evaporated.

The substrate holder may be set to rotate at a speed ranging from 1 to 100 rpm to form the oxyfluoride coating layer on the substrate.

Oxygen may be supplied into the chamber through a gas supply device while the oxide evaporation source is evaporated, and a flow rate of the supplied oxygen may be controlled to be in a range of 0.01 to 20 sccm.

A deposition rate of the oxyfluoride coating layer may be controlled to be in a range of 10 to 200 nm/min.

A thickness of the oxyfluoride coating layer may be controlled to be in a range of 0.2 to 50 μm.

The fluorine content contained in the oxyfluoride may be regulated by regulating the number of second crucibles accommodating the fluoride to adjust the evaporation amount of the fluoride.

The evaporation amount of the fluoride may be regulated by regulating an opening of a second crucible cover for accommodating the fluoride.

The degree of opening and closing of the opening of the second crucible cover may be controlled over time to control the fluorine content of the oxyfluoride coating layer formed by deposition.

The fluoride may be evaporated without additional heating or evaporated using resistive electrical heating rather than a high energy heat source such as an electron beam.

Hereinafter, a method of forming a plasma resistant oxyfluoride coating layer according to an exemplary embodiment of the present invention will be described in more detail.

The present invention relates to a method of forming an oxyfluoride coating layer on a substrate using a reactive physical vapor deposition method, wherein the substrate for depositing a coating layer is mounted inside a chamber maintaining a vacuum, and an oxyfluoride is deposited on the substrate by evaporating an oxide (evaporation source) and a fluoride to be deposited on the substrate and reacting an evaporation gas of the oxide with a fluorine-containing gas.

FIG. 1 is a diagram schematically illustrating a reactive physical vapor deposition apparatus for forming an oxyfluoride coating layer.

Referring to FIG. 1, the reactive physical vapor deposition apparatus includes a chamber 10 for maintaining a vacuum, an electron gun 20 is installed in the chamber 10, and a first crucible 30 for accommodating an oxide evaporation source is installed at a position adjacent to the electron gun 20. A permanent magnet (not shown) for deflecting an electron beam irradiated from the electron gun 20 by a magnetic field and making it incident on the oxide evaporation source accommodated in the first crucible 30 is disposed between the electron gun 20 and the first crucible 30. In addition, a second crucible 35 for accommodating a fluoride is provided in the chamber 10. A substrate holder 40 is installed on an upper portion of the chamber 10 facing the oxide evaporation source, and a substrate 50 on which an oxyfluoride is deposited is installed on a lower surface of the substrate holder 40. The substrate holder 40 may be rotatably provided for uniform deposition. A shutter 60 is installed under the substrate 50 to block an evaporation path to the substrate 50 until the oxide evaporation source is heated and melted. A blocking plate 70 may be installed between the oxide evaporation source and the substrate 50 to minimize damage to the substrate 50 due to secondary electrons generated during reactive physical vapor deposition. The blocking plate 70 may be made of a conductive material such as a copper plate, and may be connected to a direct current power source. In addition, the electron beam deposition apparatus may be provided with a sensor 80 for detecting the thickness of a layer deposited on the substrate 50, and a gas supply device 90 and a valve 95 for supplying oxygen (02) gas into the chamber 10 may be provided. In FIG. 1, P/S means a power supply.

In the reactive physical vapor deposition apparatus having the above structure, the electron beam scanned from the electron gun 20 is deflected by the permanent magnet and is incident on the oxide evaporation source accommodated in the first crucible 30, and accordingly, the oxide evaporation source is heated and melted. At this time, since the shutter 60 is provided under the substrate 50, the evaporation path of an evaporation gas generated by the oxide evaporation source is blocked. When the shutter 60 opens the evaporation path, the evaporation gas of the oxide evaporation source proceeds upward along the evaporation path and arrives at the substrate 50 mounted on the lower surface of the substrate holder 40. By the incident electron beam, the oxide evaporation source is heated, melted, and vaporized, thereby causing the evaporation gas to proceed upward along the evaporation path. The oxide evaporation source may include one or more materials selected from the group consisting of $Y_2O_3$ and $Al_2O_3$.

A fluorine-containing fluoride in a solid state is accommodated in the second crucible 35. The second crucible 35 accommodating the fluoride is placed in the chamber 10, but it is preferable to place it separately from the first crucible 30 accommodating the oxide evaporation source. The number of crucibles accommodating the fluoride may be one or more depending on the composition of the oxyfluoride to be coated. When it is desired to increase the fluorine content of the oxyfluoride coating layer, it is preferable to set the number of crucibles to two or more. In addition, a shutter (not shown) capable of controlling the opening of the crucible may be provided.

The fluoride acts as a source for supplying fluorine-containing gas, and it is preferable to use a raw material including fluorine and having high volatility. The fluoride may include one or more solid materials selected from the group consisting of $NH_4F$, $NH_5F_2$, $MgF_2$, $AlF_3$, and $YF_3$. Materials such as $NH_4F$ and $NH_5F_2$ contain highly reactive $F^-$ anions. In particular, fluorides such as $NH_4F$ and $NH_5F_2$ contain fluorine and are highly volatile, and thus may not require additional heating, and accordingly have a low sublimation temperature and are easy to handle because the fluorides are present in a solid state. Fluorides such as $MgF_2$, $AlF_3$, and $YF_3$, are volatile raw materials containing fluorine, and are solid materials that can be volatilized by conventional resistive electrical heating rather than a high energy heating source.

A separate heating device (not shown) for heating the second crucible 35 accommodating the fluoride may be provided. The fluoride can be heated and vaporized more effectively by the heating device. The fluoride may be evaporated without additional heating or evaporated using resistive electrical heating. In the case of an ammonium fluoride-based fluoride accommodated in the second crucible, a sufficient amount of volatilization can be obtained only with the ambient temperature in the chamber whose inside is maintained in a high vacuum, so that gasification occurs easily without a separate heating device. The fluorides such as $MgF_2$, $AlF_3$, and $YF_3$, accommodated in the second crucible are low-melting-point materials and are solid materials that can be evaporated by conventional resistive electrical heating rather than a high energy heating source such as an electron beam.

The fluorine content contained in the oxyfluoride may be regulated by regulating the number of second crucibles accommodating the fluoride to adjust the evaporation amount of the fluoride. For example, in Example 1 to be described below, a fluoride was put into one second crucible and deposited, and in Example 2, the fluoride was put into two second crucibles and deposited, and as in Example 2, when the fluoride was put into two second crucibles and deposited, it was found that the fluorine content of the oxyfluoride coating layer formed by deposition was higher than that of the oxyfluoride coating layer formed according to Example 1. Considering this point, as the number of second crucibles accommodating the fluoride increases, the fluorine content in the oxyfluoride coating layer formed by deposition may increase.

A cover (not shown) for covering the upper portion of the second crucible accommodating the fluoride may be provided, the second crucible cover may be provided with an opening, and the evaporation amount of the fluoride may be regulated by regulating the opening of the second crucible cover. For example, the evaporation amount of the fluoride may be regulated by regulating the number of openings and the size of the opening of the second crucible cover. For example, when the number of openings is large or the size of the opening is large, the evaporation amount of the fluoride is relatively large, and accordingly, the fluorine content in the oxyfluoride coating layer formed by deposition may increase.

In order to finely adjust the evaporation amount of the fluoride, the size of the opening of the second crucible cover may be arbitrarily set, and the size of the opening may be regulated during the deposition process. The opening of the second crucible cover may regulate the opening/closing degree (for example, opening/closing amount) through a control device, thereby controlling the size or number of openings to be opened.

In addition, the degree of opening and closing of the opening of the second crucible cover may be controlled over time to control the fluorine content of the oxyfluoride coating layer formed by deposition. For example, by closing the opening of the second crucible cover at the beginning of deposition and opening the opening after a certain period of time to allow the fluoride to be deposited, the fluorine content may be higher on the surface than inside the oxyfluoride coating layer. In addition, the opening of the second crucible cover may be closed at the beginning of deposition, and the amount of opening and closing of the opening may be increased over time to increase the fluorine content from the inside to the surface of the oxyfluoride coating layer. In this case, it is possible to suppress the generation of stress at an interface between the substrate material and the oxyfluoride coating layer, which usually have a large difference in coefficient of thermal expansion, so that the occurrence of defects, such as peeling of the coating layer after deposition, can be suppressed.

Since the shutter 60 is provided under the substrate 50, the evaporation path of the gas generated by the fluoride is blocked. When the shutter 60 opens the evaporation path, the gas generated from the fluoride proceeds upward along the evaporation path and arrives at the substrate 50 mounted on the lower surface of the substrate holder 40.

The oxyfluoride coating layer is formed on the substrate 50 through a reaction between the evaporation gas generated from the oxide evaporation source and the fluorine-containing gas generated from the fluoride.

Hereinafter, a method of forming an oxyfluoride coating layer using a reactive physical vapor deposition method will be described in more detail.

Suitable substrates for forming the oxyfluoride coating layer using the reactive physical vapor deposition method are silicon, oxide-based, nitride-based, carbide-based, non-oxide-based ceramics sintered bodies, and metal materials such as aluminum. In addition, in the case of an inner material for a plasma process for manufacturing a semiconductor device or display, quartz ($SiO_2$) and silicon (Si) may be widely used in members such as a chamber liner, a CVD boat, a focus ring, and a wall liner, and ceramic materials such as alumina ($Al_2O_3$) and aluminum nitride (AlN) used in electrostatic chucks and heaters may be applied.

To form the oxyfluoride coating layer, it is preferable to coat the oxyfluoride after treating the substrate surface so that the average surface roughness Ra has a surface roughness of 100 nm or less through mirror polishing. This is because, when the average surface roughness Ra of the substrate is 100 nm or more, the microstructure and surface roughness of the oxyfluoride coating layer are adversely affected by the surface roughness.

The substrate is mounted on the substrate holder 40 provided in the chamber 10 of the reactive physical vapor deposition apparatus. It is preferable to set the temperature of the substrate 50 in the range of 100 to 700° C. using a heating device. The substrate holder 40 may be set to rotate at a speed ranging from 1 to 100 rpm.

The oxide evaporation source is accommodated in the first crucible 30, and the first crucible 30 accommodating the oxide evaporation source is mounted in the chamber 10.

The fluoride is accommodated in the second crucible 35, and the second crucible 35 accommodating the fluoride is mounted in the chamber 10.

The electron beam scanned from the electron gun 20 of the reactive physical vapor deposition apparatus is deflected by the permanent magnet to be incident on the oxide evaporation source accommodated in the first crucible. The power applied to the electron gun 20 through the power supply may be set in the range of 1 to 10 kW.

As the electron beam is incident on the oxide evaporation source, the oxide evaporation source is heated, melted, and vaporized to cause the evaporation gas to proceed upward along the evaporation path. Due to the high energy of the electron beam, the oxide evaporation source is heated to a temperature of 1000° C. or higher, so that evaporation occurs and gas vapor is generated.

The fluoride accommodated in the second crucible 35 is also vaporized so that the fluorine-containing gas proceeds upward along the evaporation path. Fluorides such as $NH_4F$ and $NH_5F_2$ contain fluorine and have high volatility, and thus do not require separate heating, and vaporization occurs in the environment in the chamber 10 without additional heating to generate the fluorine-containing gas. Fluorides such as $AlF_3$ and $YF_3$ can be volatilized by conventional resistive electrical heating rather than a high energy heating source, and vaporization occurs by such heating to generate the fluorine-containing gas.

The shutter 60 located under the substrate 50 is opened to allow the evaporation gas of the oxide evaporation source to proceed along the evaporation path toward the substrate 50, the gas vaporized from the fluoride also proceeds along the evaporation path toward the substrate 50, so that the oxyfluoride is deposited on one surface of the substrate 50 mounted on the lower surface of the substrate holder 40. Oxygen is supplied into the chamber 10 through the gas supply device 90 while the oxide evaporation source is evaporated, and a flow rate of the supplied oxygen is controlled to be in the range of 0.01 to 20 sccm. It is preferable to control the vacuum degree in the chamber 10 to be in the range of 0.01 to 1 mTorr while the oxide evaporation source is evaporated.

The oxyfluoride coating layer is formed on the substrate 50 through a reaction between the evaporation gas generated from the oxide and the fluorine-containing gas generated from the fluoride.

It is preferable that a deposition rate of the oxyfluoride coating layer is controlled to be in the range of 10 to 200 nm/min, and the thickness of the oxyfluoride coating layer is controlled to be in the range of 0.2 to 50 μm. It is preferable that the oxyfluoride coating layer to be coated on the substrate is formed to the thickness of 0.2 to 50 μm. The reason is that in the case of 0.2 μm or less, the lifetime of the plasma resistant member is short, and in the case of 50 μm or more, the coating layer may peel off due to cracks caused by the difference in thermal stress between the substrate and the coating layer, which may cause serious problems during the plasma process.

The oxyfluoride coating layer formed by the method according to an exemplary embodiment of the present invention does not have large pores of 0.1 μm or more, has a surface roughness (Ra) of 100 nm or less, and is stable against chemical reactions on the surface in a plasma environment, so that it maintains a stable state in a plasma corrosive environment, and thus contaminant particles are not generated, and even when used as a plasma resistant member, a lifetime can be improved.

The oxyfluoride coating layer coated on the substrate for use as the plasma resistant member shows excellent etch resistance in a plasma environment containing a halogen gas. According to the research of the present inventors, since the oxyfluoride is stable against chemical reactions in a fluorine-based plasma environment, it maintains a stable state in a plasma corrosive environment.

Since the oxyfluoride coating layer formed by the conventional thermal spraying method has a surface roughness of 500 nm or more and contains many pores therein, the reactive gas penetrates into the coating layer through the pores, thereby increasing the occurrence frequency of contaminant particles and causing selective etching due to high surface roughness, which is a major cause of shortening the lifetime of the plasma resistant member.

Hereinafter, Experimental Examples according to the present invention are specifically presented, and the present invention is not limited to the Experimental Examples presented below.

Example 1

A sapphire ceramic substrate having a diameter of 50 mm and mirror-polished to an average surface roughness of 10 nm or less was mounted on a substrate holder of an electron beam deposition apparatus, and an electron beam scanned from an electron gun was deflected by a permanent magnet to be incident on an evaporation source made of $Y_2O_3$ accommodated in a first crucible. At this time, power applied to the electron gun through a power supply was set to 150 mA. A distance between the substrate and the evaporation source was about 480 mm. A temperature of the substrate was set to 200° C. by temperature, and the substrate holder was set to rotate at a speed of about 20 rpm. A flow rate of oxygen introduced into a chamber through a gas supply device was set to about 5 sccm. A vacuum degree in the chamber was set to approximately 0.1 mTorr.

As a raw material containing fluorine, $NH_4F$ was used. $NH_4F$ having a low sublimation temperature has the advantage of being easy to handle as it is present in a solid state. A second crucible having a size of 30 cc was filled with 6 g of $NH_4F$. The second crucible filled with $NH_4F$ was placed at a position separate from the evaporation source made of $Y_2O_3$ in the chamber, and there was no heating device.

First, when the electron beam was incident on the $Y_2O_3$ evaporation source, the evaporation source was heated and melted, and vaporization started, a shutter placed above the evaporation source was opened to allow an evaporation gas of the evaporation source to proceed along an evaporation path toward the substrate, and the gas vaporized from the fluoride also proceeded along the evaporation path toward the substrate to be deposited on one surface of the substrate mounted on the lower surface of the substrate holder. A deposition rate of the YOF coating layer deposited on the substrate surface was sensed through a sensor, and the deposition rate measured through the sensor was about 2 nm/sec.

Figure 2:
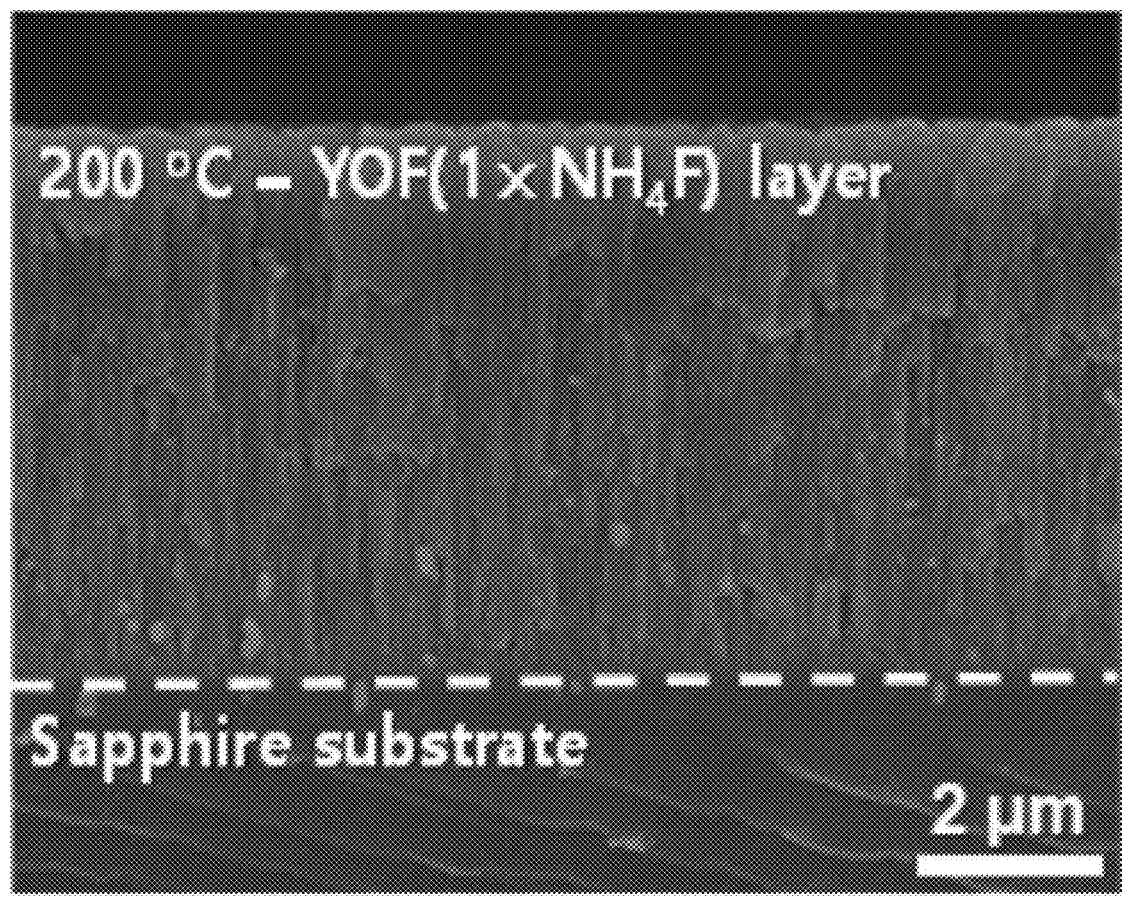
FIG. 2 is a scanning electron microscope (SEM) photograph showing a cross-section of an oxyfluoride (YOF) coating layer formed on a sapphire ceramic substrate according to Example 1.
Figure 3:
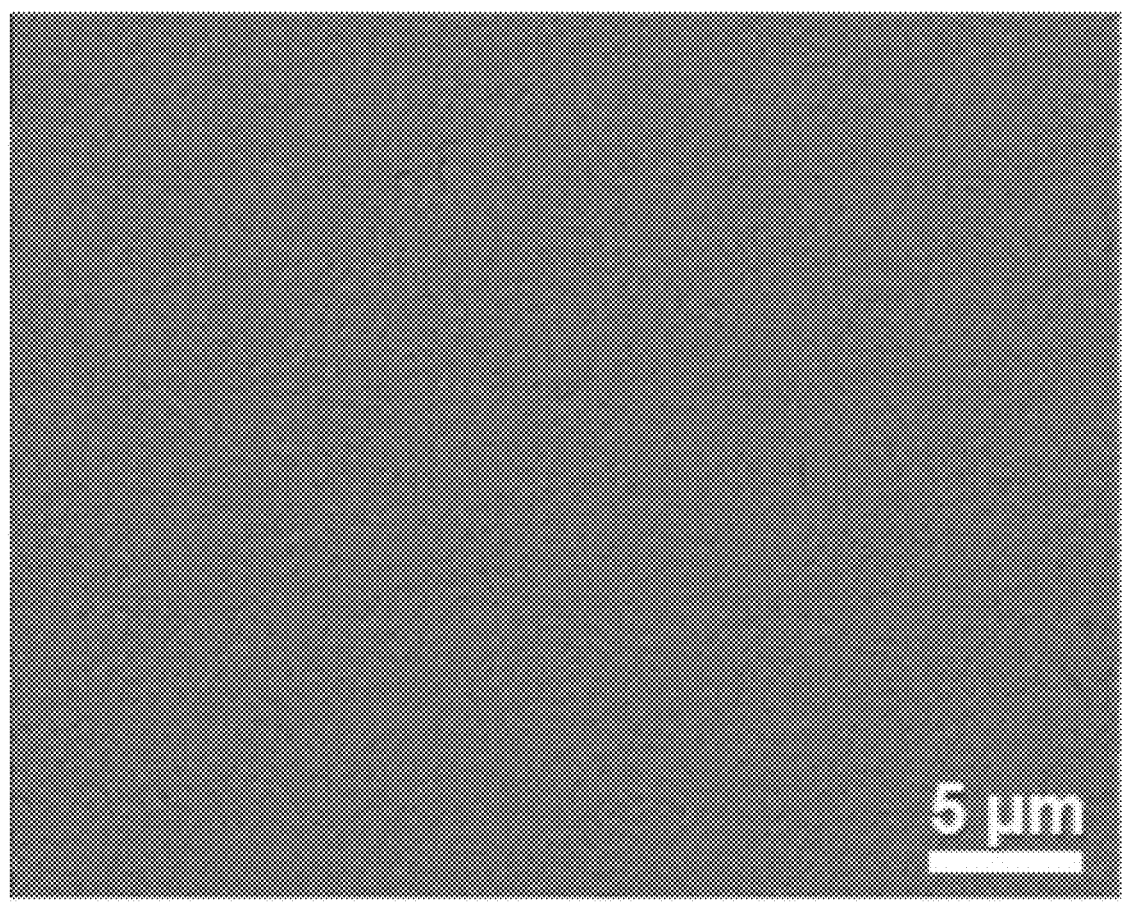
FIG. 3 is a scanning electron microscope (SEM) photograph showing a surface of the oxyfluoride (YOF) coating layer formed on the sapphire ceramic substrate according to Example 1.

The YOF coating layer deposited on the substrate was formed to a thickness of 6 μm. FIG. 2 is a scanning electron microscope (SEM) photograph showing a cross-section of an oxyfluoride (YOF) coating layer formed on a sapphire ceramic substrate according to Example 1, and FIG. 3 is a scanning electron microscope (SEM) photograph showing the surface of the oxyfluoride (YOF) coating layer formed on the sapphire ceramic substrate according to Example 1. Components of the oxyfluoride (YOF) coating layer prepared according to Example 1 were analyzed and shown in Table 1 below.

TABLE 1

| Element | Composition (at %) |
|---|---|
| O | 50.2 |
| F | 22.3 |
| Y | 27.5 |
| total | 100.00 |

Example 2

A sapphire ceramic substrate having a diameter of 50 mm and mirror-polished to an average surface roughness of 10 nm or less was mounted on a substrate holder of an electron beam deposition apparatus, and an electron beam scanned from an electron gun was deflected by a permanent magnet to be incident on an evaporation source made of $Y_2O_3$ accommodated in a first crucible. At this time, power applied to the electron gun through a power supply was set to 150 mA. A distance between the substrate and the evaporation source was about 480 mm. A temperature of the substrate was set to 200° C. by temperature, and the substrate holder was set to rotate at a speed of about 20 rpm. A flow rate of oxygen introduced into a chamber through a gas supply device was set to about 5 sccm. A vacuum degree in the chamber was set to approximately 0.1 mTorr.

As a raw material containing fluorine, $NH_4F$ was used. Two 30 cc-sized second crucibles were each filled with 6 g of $NH_4F$. The two second crucibles filled with $NH_4F$ was placed at positions separate from the evaporation source made of $Y_2O_3$ in the chamber, and there was no heating device.

First, when the electron beam was incident on the $Y_2O_3$ evaporation source, the evaporation source was heated and melted, and vaporization started, a shutter placed above the evaporation source was opened to allow an evaporation gas of the evaporation source to proceed along an evaporation path toward the substrate, and the gas vaporized from the fluoride proceeded along the evaporation path toward the substrate to be deposited on one surface of the substrate mounted on the lower surface of the substrate holder. A deposition rate of the YOF coating layer deposited on the substrate surface was sensed through a sensor, and the deposition rate measured through the sensor was about 2 nm/sec.

Figure 4:
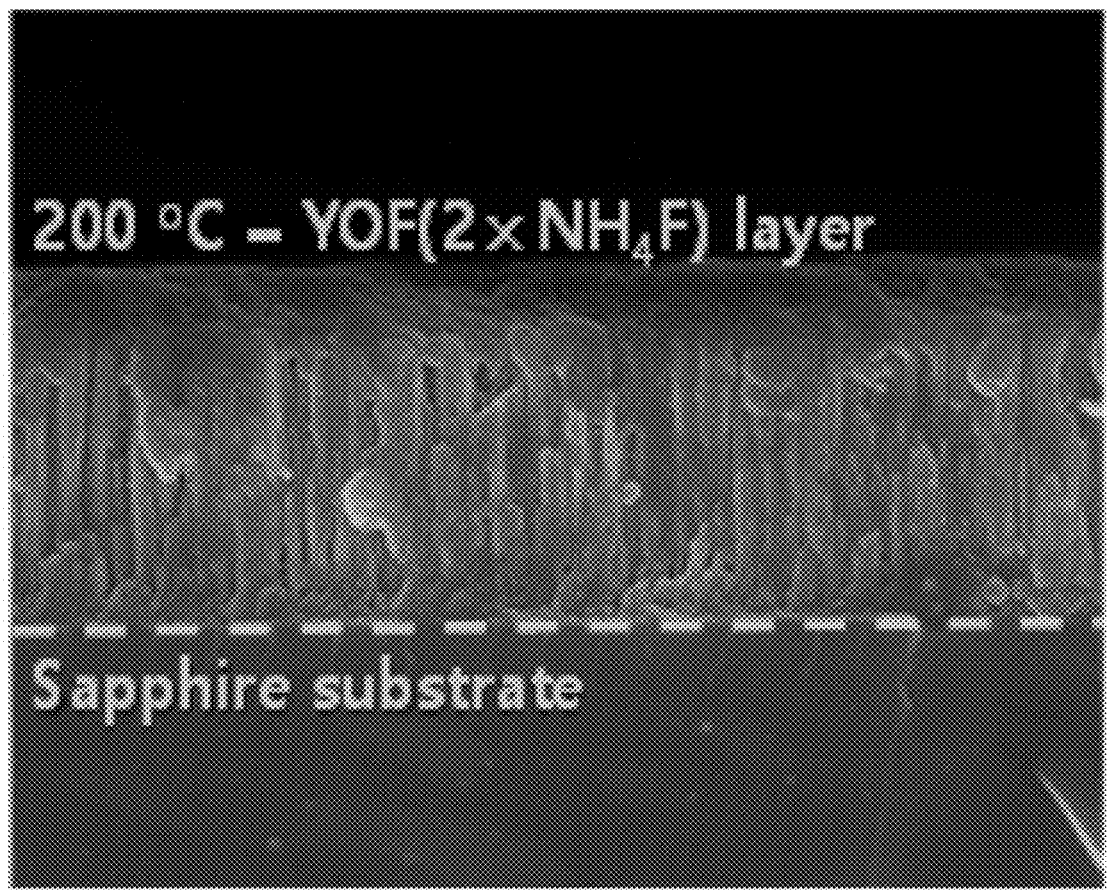
FIG. 4 is a scanning electron microscope (SEM) photograph showing a cross-section of an oxyfluoride (YOF) coating layer formed on a sapphire ceramic substrate according to Example 2.
Figure 5:
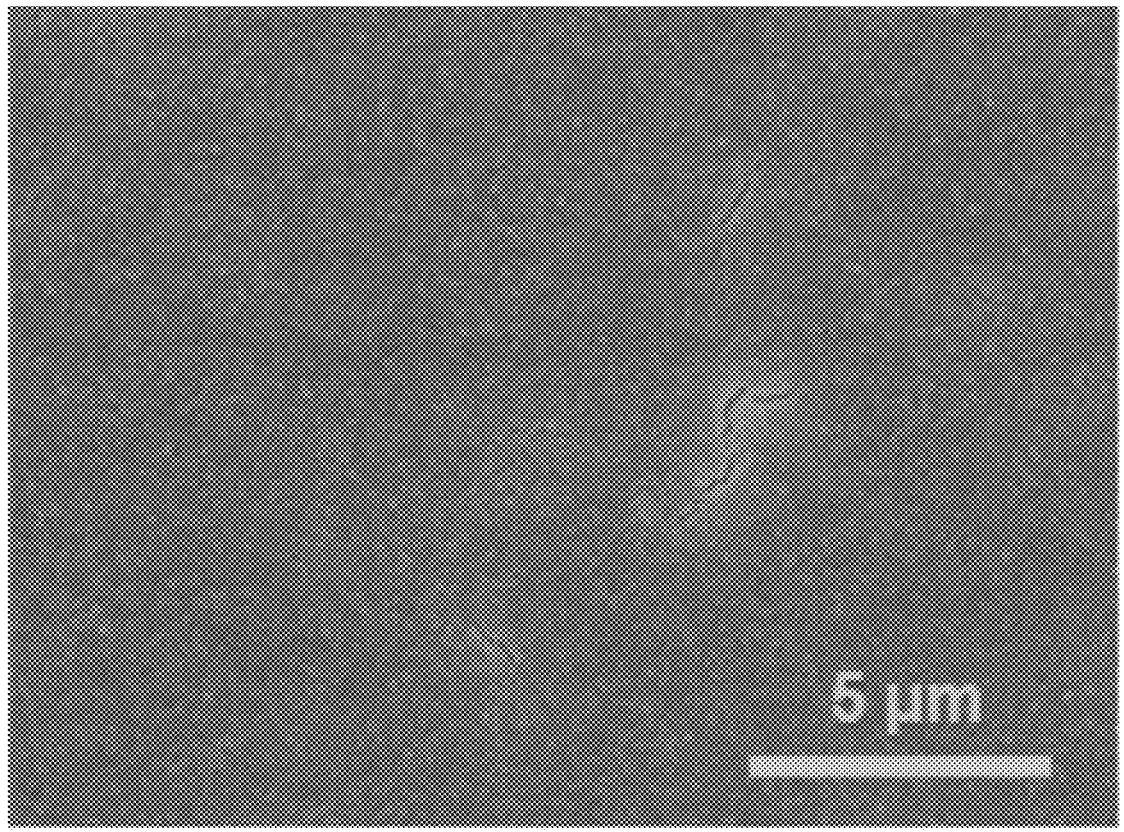
FIG. 5 is a scanning electron microscope (SEM) photograph showing a surface of the oxyfluoride (YOF) coating layer formed on the sapphire ceramic substrate according to Example 2.

The YOF coating layer deposited on the substrate was formed to a thickness of 5 μm. FIG. 4 is a scanning electron microscope (SEM) photograph showing a cross-section of an oxyfluoride (YOF) coating layer formed on a sapphire ceramic substrate according to Example 2, and FIG. 5 is a scanning electron microscope (SEM) photograph showing the surface of the oxyfluoride (YOF) coating layer formed on the sapphire ceramic substrate according to Example 2. Components of the oxyfluoride (YOF) coating layer prepared according to Example 2 were analyzed and shown in Table 2 below.

TABLE 2

| Element | Composition (at %) |
|---------|---------------------|
| O       | 14.1                |
| F       | 46.3                |
| Y       | 39.6                |
| total   | 100.00              |

Example 3

A sapphire ceramic substrate having a diameter of 50 mm and mirror-polished to an average surface roughness of 10 nm or less was mounted on a substrate holder of an electron beam deposition apparatus, and an electron beam scanned from an electron gun was deflected by a permanent magnet to be incident on an evaporation source made of $Y_2O_3$ accommodated in a first crucible. At this time, power applied to the electron gun through a power supply was set to 150 mA. A distance between the substrate and the evaporation source was about 480 mm. A temperature of the substrate was set to 400° C. by temperature, and the substrate holder was set to rotate at a speed of about 20 rpm. A flow rate of oxygen introduced into a chamber through a gas supply device was set to about 5 sccm. A vacuum degree in the chamber was set to approximately 0.1 mTorr.

As a raw material containing fluorine, $NH_4F$ was used. $NH_4F$ having a low sublimation temperature has the advantage of being easy to handle as it is present in a solid state. A second crucible having a size of 30 cc was filled with 6 g of $NH_4F$. The second crucible filled with $NH_4F$ was placed at a position separate from the evaporation source made of $Y_2O_3$ in the chamber, and there was no heating device.

First, when the electron beam was incident on the $Y_2O_3$ evaporation source, the evaporation source was heated and melted, and vaporization started, a shutter placed above the evaporation source was opened to allow an evaporation gas of the evaporation source to proceed along an evaporation path toward the substrate, and the gas vaporized from the fluoride also proceeded along the evaporation path toward the substrate to be deposited on one surface of the substrate mounted on the lower surface of the substrate holder. A deposition rate of the YOF coating layer deposited on the substrate surface was sensed through a sensor, and the deposition rate measured through the sensor was about 2 nm/sec.

Figure 6:
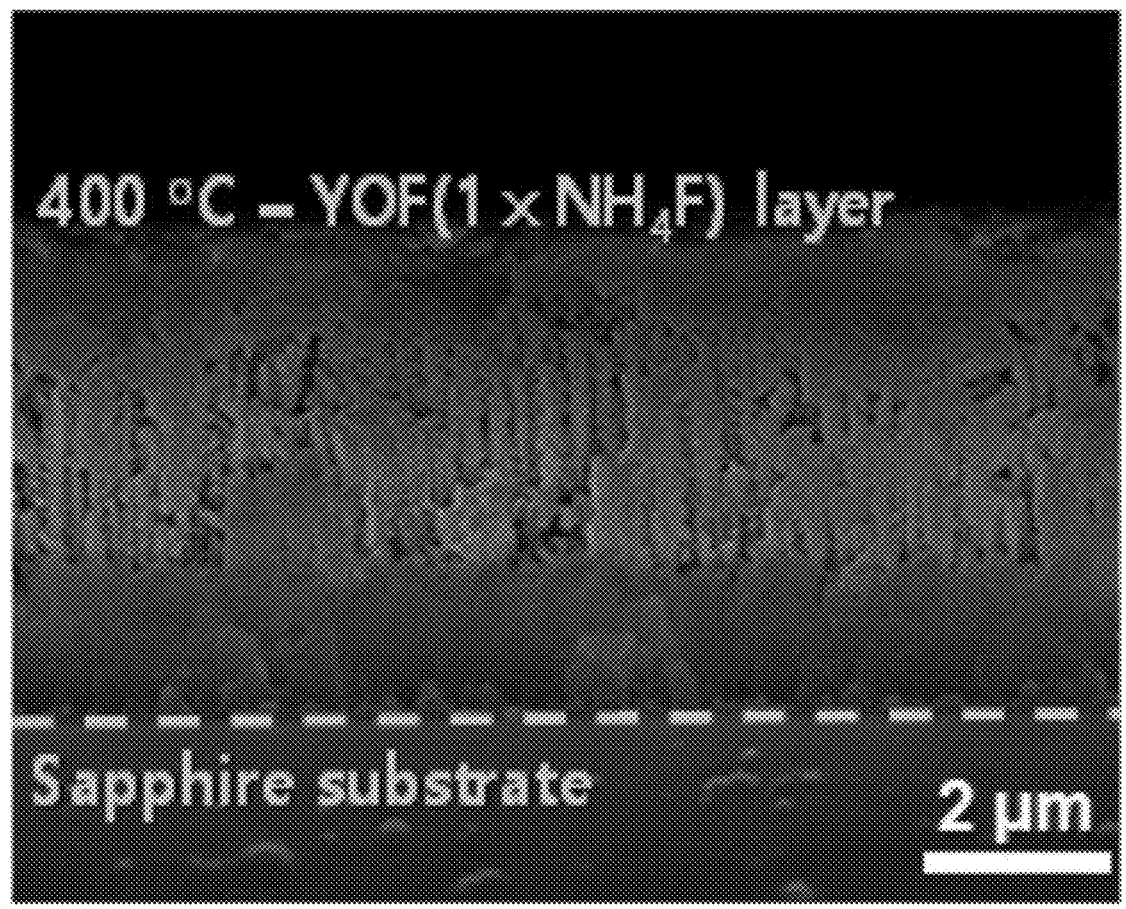
FIG. 6 is a scanning electron microscope (SEM) photograph showing a cross-section of an oxyfluoride (YOF) coating layer formed on a sapphire ceramic substrate according to Example 3.
Figure 7:
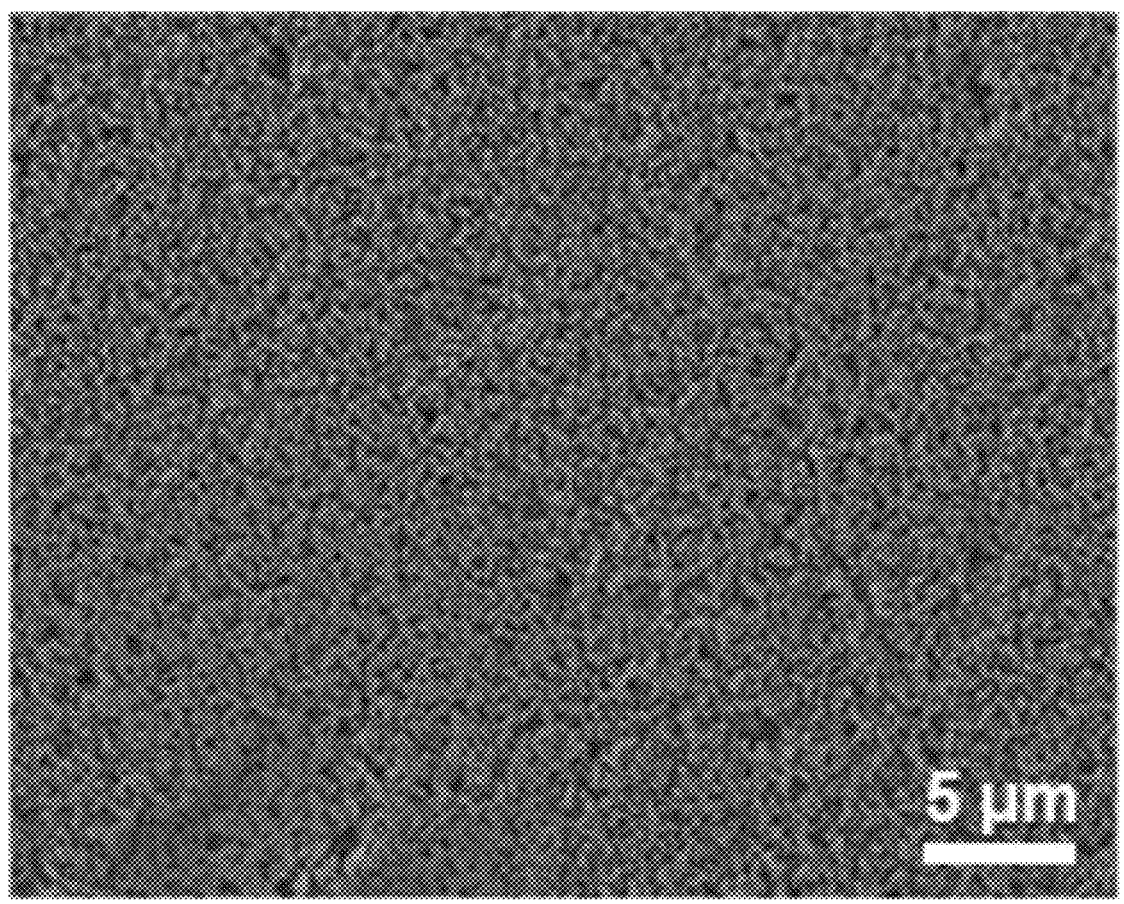
FIG. 7 is a scanning electron microscope (SEM) photograph showing a surface of the oxyfluoride (YOF) coating layer formed on the sapphire ceramic substrate according to Example 3.

The YOF coating layer deposited on the substrate was formed to a thickness of 5 μm. FIG. 6 is a scanning electron microscope (SEM) photograph showing a cross-section of an oxyfluoride (YOF) coating layer formed on a sapphire ceramic substrate according to Example 3, and FIG. 7 is a scanning electron microscope (SEM) photograph showing the surface of the oxyfluoride (YOF) coating layer formed on the sapphire ceramic substrate according to Example 3. Components of the oxyfluoride (YOF) coating layer prepared according to Example 3 were analyzed and shown in Table 3 below.

TABLE 3

| Element | Composition (at %) |
|---------|---------------------|
| O       | 43.23               |
| F       | 27.95               |
| Y       | 28.82               |
| total   | 100.00              |

Example 4

A sapphire ceramic substrate having a diameter of 50 mm and mirror-polished to an average surface roughness of 10 nm or less was mounted on a substrate holder of an electron beam deposition apparatus, and an electron beam scanned from an electron gun was deflected by a permanent magnet to be incident on an evaporation source made of $Al_2O_3$ accommodated in a first crucible. At this time, power applied to the electron gun through a power supply was set to 150 mA. A distance between the substrate and the evaporation source was about 480 mm. A temperature of the substrate was set to 200° C. by temperature, and the substrate holder was set to rotate at a speed of about 20 rpm. A flow rate of oxygen introduced into a chamber through a gas supply device was set to about 5 sccm. A vacuum degree in the chamber was set to approximately 0.1 mTorr.

As a raw material containing fluorine, $NH_4F$ was used. $NH_4F$ having a low sublimation temperature has the advantage of being easy to handle as it is present in a solid state. A second crucible having a size of 30 cc was filled with 6 g of $NH_4F$. The second crucible filled with $NH_4F$ was placed at a position separate from the evaporation source made of $Al_2O_3$ in the chamber, and there was no heating device.

First, when the electron beam was incident on the $Al_2O_3$ evaporation source, the evaporation source was heated and melted, and vaporization started, a shutter placed above the evaporation source was opened to allow an evaporation gas of the evaporation source to proceed along an evaporation path toward the substrate, and the gas vaporized from the fluoride also proceeded along an evaporation path toward the substrate to be deposited on one surface of the substrate mounted on the lower surface of the substrate holder. A deposition rate of the AlOF coating layer deposited on the substrate surface was sensed through a sensor, and the deposition rate measured through the sensor was about 2 nm/sec.

Figure 8:
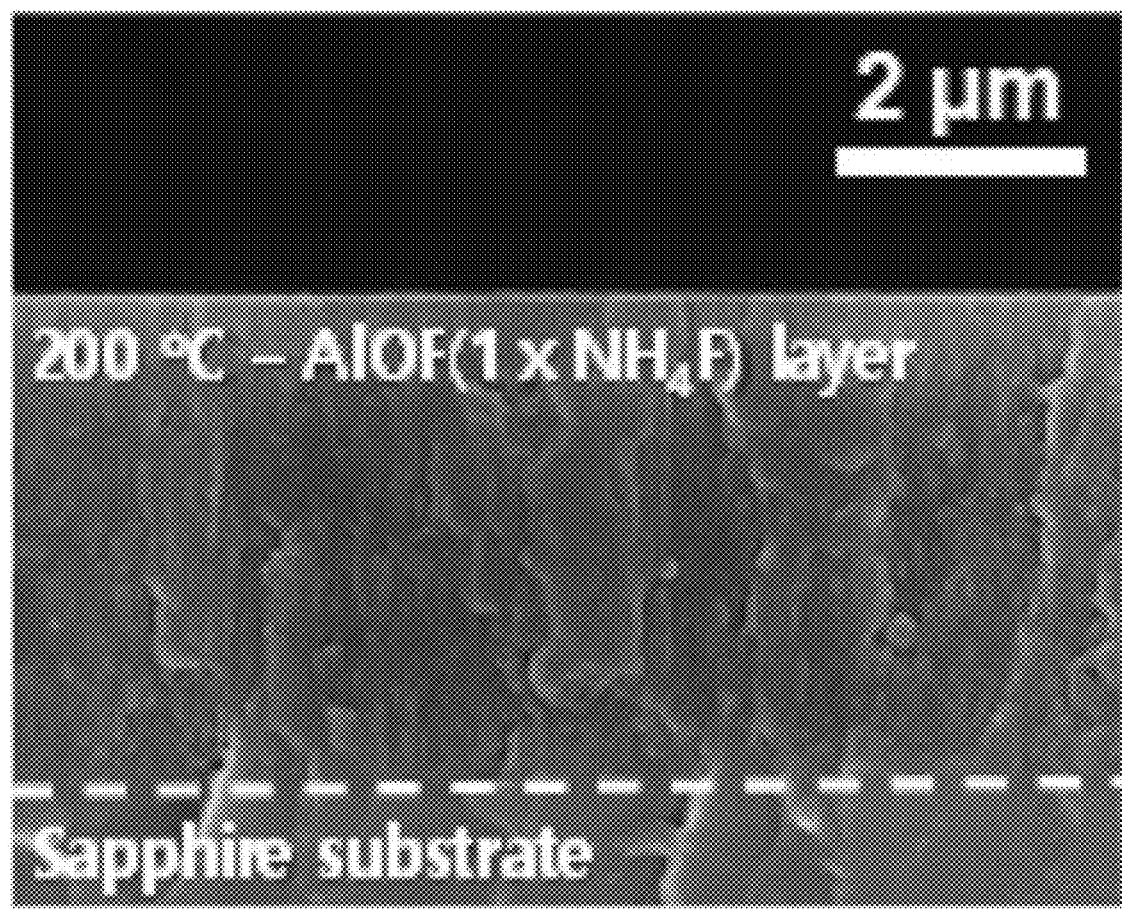
FIG. 8 is a scanning electron microscope (SEM) photograph showing a cross-section of an oxyfluoride (AlOF) coating layer formed on a sapphire ceramic substrate according to Example 4.
Figure 9:
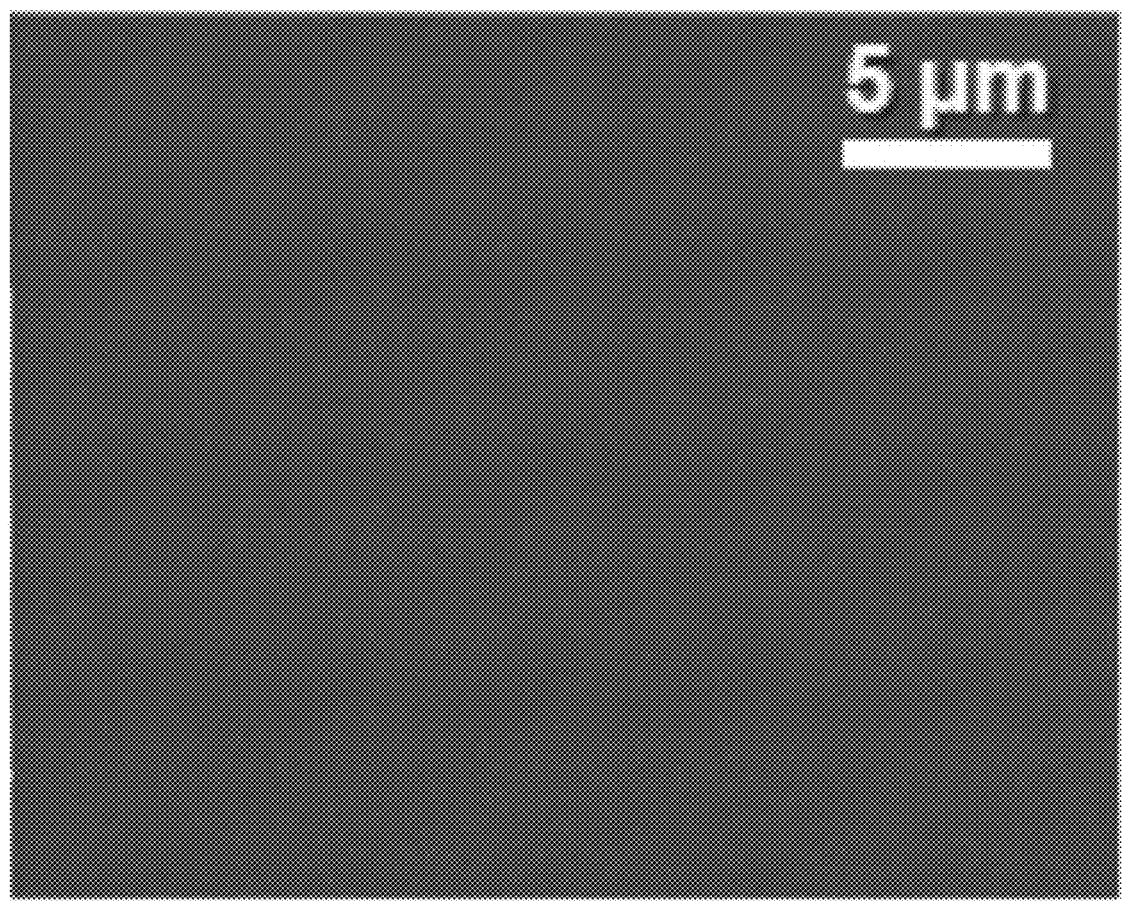
FIG. 9 is a scanning electron microscope (SEM) photograph showing a surface of the oxyfluoride (AlOF) coating layer formed on the sapphire ceramic substrate according to Example 4.

The AlOF coating layer deposited on the substrate was formed to a thickness of 4 μm. FIG. 8 is a scanning electron microscope (SEM) photograph showing a cross-section of an oxyfluoride (AlOF) coating layer formed on a sapphire ceramic substrate according to Example 4, and FIG. 9 is a scanning electron microscope (SEM) photograph showing the surface of the oxyfluoride (AlOF) coating layer formed on the sapphire ceramic substrate according to Example 4. Components of the oxyfluoride (AlOF) coating layer prepared according to Example 4 were analyzed and shown in Table 4 below.

TABLE 4

| Element | Composition (at %) |
|---|---|
| O | 41.7 |
| F | 13.3 |
| Al | 45.0 |
| total | 100.00 |

Example 5

A sapphire ceramic substrate having a diameter of 50 mm and mirror-polished to an average surface roughness of 10 nm or less was mounted on a substrate holder of an electron beam deposition apparatus, and an electron beam scanned from an electron gun was deflected by a permanent magnet to be incident on an evaporation source made of $Al_2O_3$ accommodated in a first crucible. At this time, power applied to the electron gun through a power supply was set to 150 mA. A distance between the substrate and the evaporation source was about 480 mm. A temperature of the substrate was set to 200° C. by temperature, and the substrate holder was set to rotate at a speed of about 20 rpm. A flow rate of oxygen introduced into a chamber through a gas supply device was set to about 5 sccm. A vacuum degree in the chamber was set to approximately 0.1 mTorr.

As a raw material containing fluorine, $NH_4F$ was used. Two 30 cc-sized second crucibles were each filled with 6 g of $NH_4F$. The two second crucibles filled with $NH_4F$ were placed at positions separate from the evaporation source made of $Al_2O_3$ in the chamber, and there was no heating device.

First, when the electron beam was incident on the $Al_2O_3$ evaporation source, the evaporation source was heated and melted, and vaporization started, a shutter placed above the evaporation source was opened to allow an evaporation gas of the evaporation source to proceed along an evaporation path toward the substrate, and the gas vaporized from the fluoride also proceeded along the evaporation path toward the substrate to be deposited on one surface of the substrate mounted on the lower surface of the substrate holder. A deposition rate of the AlOF coating layer deposited on the substrate surface was sensed through a sensor, and the deposition rate measured through the sensor was about 2 nm/sec.

Figure 10:
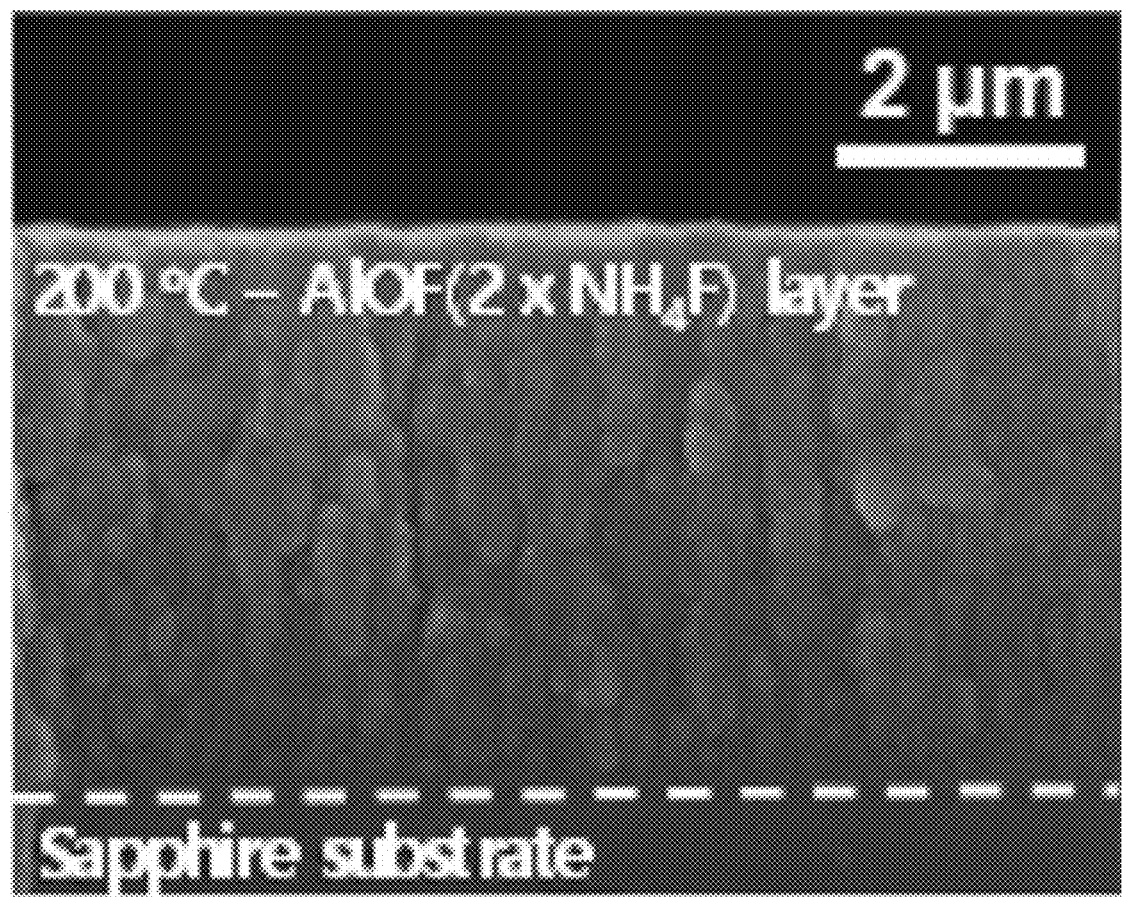
FIG. 10 is a scanning electron microscope (SEM) photograph showing a cross-section of an oxyfluoride (AlOF) coating layer formed on a sapphire ceramic substrate according to Example 5.
Figure 11:
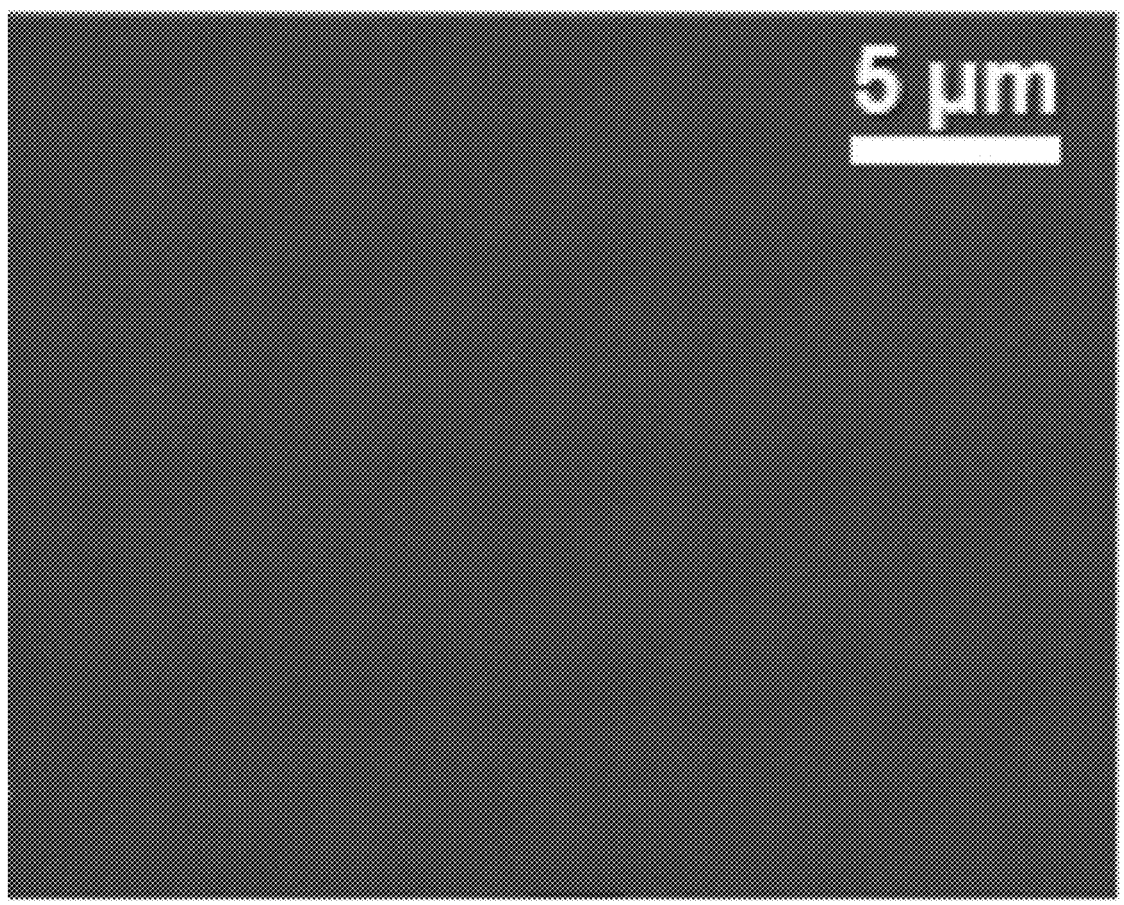
FIG. 11 is a scanning electron microscope (SEM) photograph showing a surface of the oxyfluoride (AlOF) coating layer formed on the sapphire ceramic substrate according to Example 5.

The AlOF coating layer deposited on the substrate was formed to a thickness of 5 μm. FIG. 10 is a scanning electron microscope (SEM) photograph showing a cross-section of an oxyfluoride (AlOF) coating layer formed on a sapphire ceramic substrate according to Example 5, and FIG. 11 is a scanning electron microscope (SEM) photograph showing the surface of the oxyfluoride (AlOF) coating layer formed on the sapphire ceramic substrate according to Example 5. Components of the oxyfluoride (AlOF) coating layer prepared according to Example 5 were analyzed and shown in Table 5 below.

TABLE 5

| Element | Composition (at %) |
|---|---|
| O | 37.0 |
| F | 17.8 |
| Al | 45.2 |
| total | 100.00 |

According to the present invention, a substrate for depositing a coating layer is mounted inside a chamber maintaining a vacuum, and an oxyfluoride is deposited on the substrate by evaporating an oxide (evaporation source) and a fluoride, such as ammonium fluoride, etc., to be deposited on the substrate and reacting an evaporation gas of the oxide with a fluorine-containing gas.

According to the present invention, a desired oxyfluoride coating layer can be obtained by only changing a fluoride, which is easily evaporated, without regulating evaporation process parameters of an oxide evaporation source using a high energy heat source that is difficult to control, such as an electron beam.

According to the present invention, since the evaporation amount of a fluoride is proportional to an area where a raw material is exposed to vacuum, the content of fluorine included in a coating layer can be easily regulated by changing the amount of a fluoride raw material included in a crucible, that is, the number of crucibles accommodating the fluoride, or the size of the opening of the crucible cover.

According to the present invention, an oxyfluoride coating layer can be formed using a fluoride, such as ammonium fluoride, that easily evaporates without heating in a vacuum environment.

According to the present invention, an oxyfluoride coating layer can be formed by using a fluoride, such as $MgF_2$, $AlF_3$, $YF_3$, etc., having a low melting point that is easily evaporated by conventional resistive electrical heating rather than a high energy heat source.

According to the present invention, it is possible to form a thick oxyfluoride coating layer of 0.2 to 50 μm without cracking by alleviating the difference in shrinkage and expansion between a substrate and an oxyfluoride coating layer.

The oxyfluoride coating layer formed by the present invention does not have large pores of 0.1 μm or more, has a surface roughness (Ra) of 100 nm or less, and is stable against chemical reactions on the surface in a plasma environment, so that it maintains a stable state in a plasma corrosive environment, and thus contaminant particles are not generated, and even when used as a plasma resistant member, a lifetime can be improved.

The oxyfluoride coating layer coated on the substrate for use as a plasma resistant member shows excellent etch resistance in a plasma environment containing a halogen gas. As the oxyfluoride is suppressed in chemical reaction in a fluorine-based plasma environment, the spatial uniformity of the silicon etching process can be improved, and as changes over time are suppressed, the stability of the etching process can be improved.

As mentioned above, although exemplary embodiments of the present invention have been described in detail, the present invention is not limited to the above Examples, and various modifications are possible by those skilled in the art.

What is claimed is:

1. A method of forming a plasma resistant oxyfluoride coating layer, comprising:

mounting a substrate on a substrate holder provided in a chamber;

causing an electron beam scanned from an electron gun to be incident on an oxide evaporation source accommodated in a first crucible, and heating, melting, and vaporizing the oxide evaporation source as the electron beam is incident on the oxide evaporation source;

vaporizing a fluoride accommodated in a second crucible; and advancing an evaporation gas generated from the oxide evaporation source and a fluorine-containing gas generated from the fluoride toward the substrate, and reacting the evaporation gas generated from the oxide evaporation source and the fluorine-containing gas generated from the fluoride to deposit an oxyfluoride on the substrate, wherein the fluoride comprises one or more solid materials selected from the group consisting of $NH_4F$ and $NH_5F_2$ to be evaporated without additional heating.

2. The method of claim 1, wherein the oxide evaporation source comprises one or more materials selected from the group consisting of $Y_2O_3$ and $Al_2O_3$.

3. The method of claim 1, wherein a temperature of the substrate is set in a range of 100 to 700° C.

4. The method of claim 1, wherein power applied to the electron gun through a power supply is set in a range of 1 to 10 kW.

5. The method of claim 1, wherein a vacuum degree in the chamber is controlled to be in a range of 0.01 to 1 mTorr while the oxide evaporation source is evaporated.

6. The method of claim 1, wherein the substrate holder is set to rotate at a speed ranging from 1 to 100 rpm to form the oxyfluoride coating layer on the substrate.

7. The method of claim 1, wherein oxygen is supplied into the chamber through a gas supply device while the oxide evaporation source is evaporated, and a flow rate of the supplied oxygen is controlled to be in a range of 0.01 to 20 sccm.

8. The method of claim 1, wherein a deposition rate of the oxyfluoride coating layer is controlled to be in a range of 10 to 200 nm/min.

9. The method of claim 1, wherein a thickness of the oxyfluoride coating layer is controlled to be in a range of 0.2 to 50 μm.

10. The method of claim 1, wherein a fluorine content contained in the oxyfluoride is regulated by regulating the number of second crucibles accommodating the fluoride to adjust an evaporation amount of the fluoride.

11. The method of claim 1, wherein an evaporation amount of the fluoride is regulated by regulating an opening of a second crucible cover for accommodating the fluoride.

12. The method of claim 11, wherein a degree of opening and closing of the opening of the second crucible cover is controlled over time to control a fluorine content of the oxyfluoride coating layer formed by deposition.

* * * * *